(12) United States Patent
Kim

(10) Patent No.: US 6,420,735 B2
(45) Date of Patent: Jul. 16, 2002

(54) SURFACE-EMITTING LIGHT-EMITTING DIODE

(75) Inventor: Taek Kim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/365,781

(22) Filed: Aug. 3, 1999

Related U.S. Application Data

(63) Continuation-in-part of application No. 08/909,058, filed on Aug. 14, 1997, now abandoned.

(30) Foreign Application Priority Data

May 7, 1997 (KR) ............................................ 97-17400

(51) Int. Cl.$^7$ ............................................... H01L 33/00
(52) U.S. Cl. ....................................................... 257/95
(58) Field of Search .................................. 257/95, 98

(56) References Cited

U.S. PATENT DOCUMENTS

| | | | |
|---|---|---|---|
| 5,369,289 A | * 11/1994 | Tamaki et al. ................. | 257/99 |
| 5,434,434 A | 7/1995 | Kasahara et al. | |
| 5,563,422 A | 10/1996 | Nakamura et al. | |
| 5,751,752 A | * 5/1998 | Shakuda ...................... | 372/45 |

FOREIGN PATENT DOCUMENTS

JP        53-80989    * 7/1978

\* cited by examiner

*Primary Examiner*—Olik Chaudhuri
*Assistant Examiner*—Douglas A. Wille
(74) *Attorney, Agent, or Firm*—The Law Offices of Eugene M. Lee, P.L.L.C.

(57) ABSTRACT

A surface-emitting light-emitting diode having increased light emission is provided. The surface-emitting light-emitting diode includes a substrate, a light generating layer comprising an active layer for generating light, and an upper clad layer and a lower clad layer formed on and below the active layer, respectively, a lower contact layer formed between the light generating layer and the substrate, a buffer layer formed between the lower contact layer and the substrate, a lower ohmic metal layer which ohmically contacts one side of the lower contact layer, an upper contact layer formed on the light generating layer and having a substantially sinusoidal uneven surface portion; and a light transmissive upper ohmic metal layer formed on the upper contact layer, in which the active layer is composed of GaN or AlN, the lower contact layer is composed of doped n-GaN, the upper contact layer is composed of doped p-GaN, and the substantially sinusoidal uneven surface portion increases the contact area between the upper contact layer and light transmissive upper ohmic metal layer for reducing the contact resistance therebetween. Therefore, ohmic contact resistance and operating current are reduced, so that durability is improved due to the reduction of hear generated in the device. Also, light is condensed by the substantially sinusoidal uneven surface portion and thus the amount of light which is totally reflected internally is reduced. Accordingly, no additional package device is required and external quantum efficiency is increased.

6 Claims, 6 Drawing Sheets

SURFACE-EMITTING LIGHT-EMITTING DIODE

The present application is a continuation-in-part application of the application Ser. No. 08/909,058 filed by the present applicant on Aug. 14, 1997, entitled "Surface-emitting Light-emitting Diode" now abandoned.

BACKGROUND OF THE INVENTION

1. Field of the Invention

The present invention relates to a surface-emitting light-emitting diode (SLED), and more particularly, to an SLED having a low operating voltage and the high light emission.

2. Description of the Related Art

In general, the external quantum efficiency of a light-emitting diode (LED) does not exceed 10% in the case of a highly efficient LED. Such figures are very low values considering that the efficiency of a general laser diode (LD) is over 30% to nearly 50%.

The internal quantum efficiency that is the efficiency in converting a carrier (an electron-hole) injected into an active layer of a light generation layer and combined with each other to light is usually over 90% for both LEDs and LDs. Thus, it can be easily seen that the difference in the external quantum efficiencies between LEDs and LDs results from the difference in structure between two devices.

The internal quantum efficiencies of LEDs and LDs are usually reduced by various phenomenons occurring inside a semiconductor, for example, optical absorption by the active layer, loss of free carriers, absorption at defects. In LDs, the stimulated and emitted light having directivity is aligned in a particular direction according to the given waveguide structure and meets the face of a laser beam nearly perpendicularly. Thus, the light emitted to the outside of the device or the light reflected by a surface of the face travels along the waveguide to stimulate the active layer.

However, the LED uses spontaneous emission having no particular directivity in which the light generated without a specific waveguide structure proceeds in all directions in the active layer. Here, as shown in FIG. 1, when the light is propagated through a semiconductor having a designated refractive index ns passes through another medium having a different refractive index na, for example, to the air, the photon incident on the boundary surface m between two media, i.e., the surface of a semiconductor substrate, at an angle of $\theta_2$ greater than the critical angle $\theta_c$ is output to the outside of the semiconductor substrate according to Snell's law. However, the photon incident at an angle of $\theta_1$ less than the critical angle $\theta_c$ is reflected by the boundary surface m to the inside of the semiconductor. The reflected photon may be absorbed by a crystal defect such as a dislocation in the semiconductor or absorbed by the active layer while passing therethrough. The remaining photons may pass through another boundary surface to be output to the outside. The photons failing to be output through another boundary surface may be reflected at the surface and returned to the inside of the semiconductor. The photons returned to the inside of the semiconductor may subsequently be absorbed therein. Otherwise, the photons repeat escaping through another surface. In doing so, some photons are neither absorbed by the semiconductor nor escape therefrom and endlessly travel inside the semiconductor, which is referred to as photon recycling, due to a particular output angle thereof and the symmetrical hexahedral structural feature of the semiconductor device. This phenomenon is one reason why the LEDs has a lower external quantum efficiency than the LD (refer to J. Appl. Phys, Vol. 37 (1998) 5990 part 1, No. 11, Nov. 15, 1998, Japan). The above problem is common to LEDs applied not only to GaN-based semiconductor but also to all composition semiconductors such as existing GaAs or GaP. The same problem occurs in a SLED using the light emitted along a normal line of a semiconductor layer.

FIG. 2 is a sectional view showing the stacked structure of an example of a conventional SLED having a heterojunction structure. A buffer layer 2 is formed on a substrate 1. A stepped n-contact layer 3 is formed, having a lower planarized portion at one side thereof on which an n-ohmic metal layer 9 is formed. On the n-contact layer 3, an n-lower clad layer 4, an active layer 5, a p-upper clad layer 6, a p-contact layer 7, and a translucent p-ohmic metal layer 8 are sequentially deposited. A wire bonding pad 11 is partially formed on the upper surface of the translucent p-ohmic metal layer 8.

In the above structure, in the case of a diode for blue light, the substrate 1 is generally formed of sapphire, the buffer layer 2 is formed of GaN or AlN, and two contact layers 3 and 7 are formed of n-GaN and p-GaN. The two clad layers 4 and 6 are formed of n-GaN and p-GaN or n-AlGaN and p-AlGaN, and the active layer 5 is formed of GaN and InGaN.

When power is supplied through both the ohmic contact layers 8 and 9, and current flows in the active layer 5 which is the center portion of a heterojunction structure, light is emitted from the active layer 5 due to re-combination of electrons and holes as described earlier. Here, light is emitted in all directions, and most of the light passing through the semiconductor layers disposed on and below the active layer is absorbed due to defects of the semiconductor layers. As a result, a considerably reduced amount of light passes through the translucent p-ohmic contact layer 8, and light emitted along the edge of the active layer 5 is not reduced much.

Accordingly, a SLED having the above structure is required to increase the amount of light emitted through the p-ohmic contact layer 8. Also, the drawback of a semiconductor device using III-group nitride matter is that a high operating voltage i required. The operating voltage of LED is determined by p-type contact resistance, n-type contact resistance, the resistance of a semiconductor layer where current flows, and voltage drop in the active layer. Generally, as the band gap energy of a semiconductor increases, doping becomes difficult and accordingly series resistance increases. Also, the voltage drop increases as the band gap energy increases. However, what is mattered in the GaN-based device is that p-ohmic cannot be made completely as there is not a metal having enough work function to make ohmic contact with p-GaN. Thus, the main reason for the high operating voltage of the GaN device is that the ohmic contact resistance is high.

SUMMARY OF THE INVENTION

To overcome the above problem, it is an objective of the present invention to provide a surface-emitting light-emitting diode having increased light emission.

It is another objective of the present invention to provide a surface-emitting light-emitting diode in which an ohmic contact resistance is reduced, to lower the current used and thus the amount of heat generated, thereby providing improved durability.

Accordingly, to achieve the above objectives, there is provided a surface-emitting light-emitting diode which comprises: a substrate; a light generating layer comprising an active layer for generating light, and an upper clad layer and a lower clad layer formed on and below the active layer, respectively; a lower contact layer formed between the light generating layer and the substrate; a buffer layer formed between the lower contact layer and the substrate; a lower ohmic metal layer which ohmically contacts one side of the lower contact layer; an upper contact layer formed on the light generating layer and having an uneven surface portion that is substantially sinusoidal; and a light transmissive upper ohmic metal layer formed on the upper contact layer. In the above surface-emitting light-emitting diode, the active layer is composed of GaN or AlN, the lower contact layer is composed of doped n-GaN, the upper contact layer is composed of doped p-GaN, and the substantially sinusoidal uneven surface portion increases the contact area between the upper contact layer and light transmissive upper ohmic metal layer for reducing the contact resistance therebetween.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1:
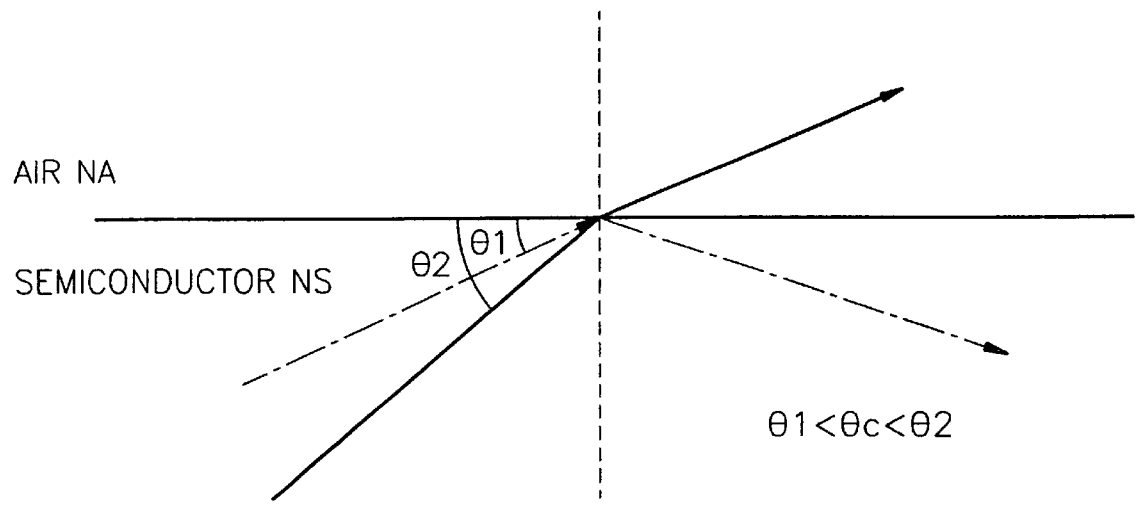
FIG. 1 shows photons incident at different angles on a boundary surface between a semiconductor layer and an air layer having different refractive indices reflected or passing through the boundary surface in a conventional SLED.
Figure 2:
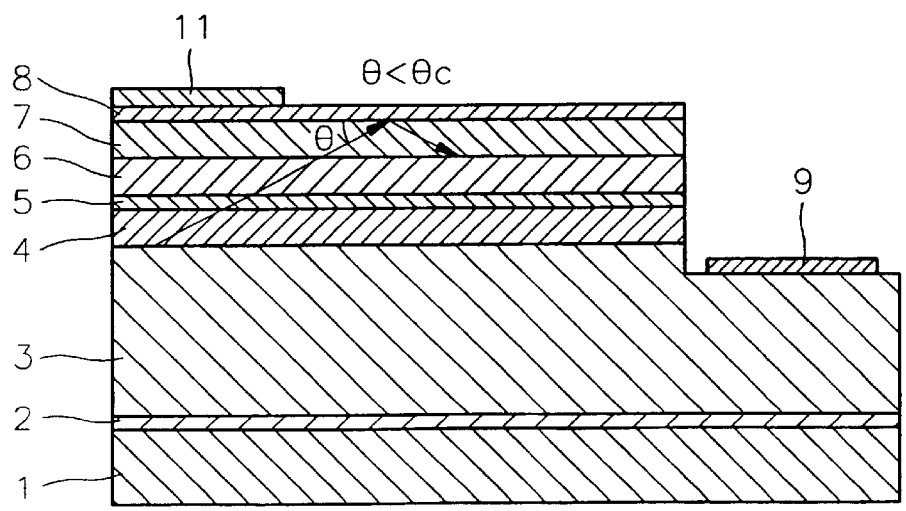
FIG. 2 is a sectional view illustrating the conventional SLED.
Figure 3:
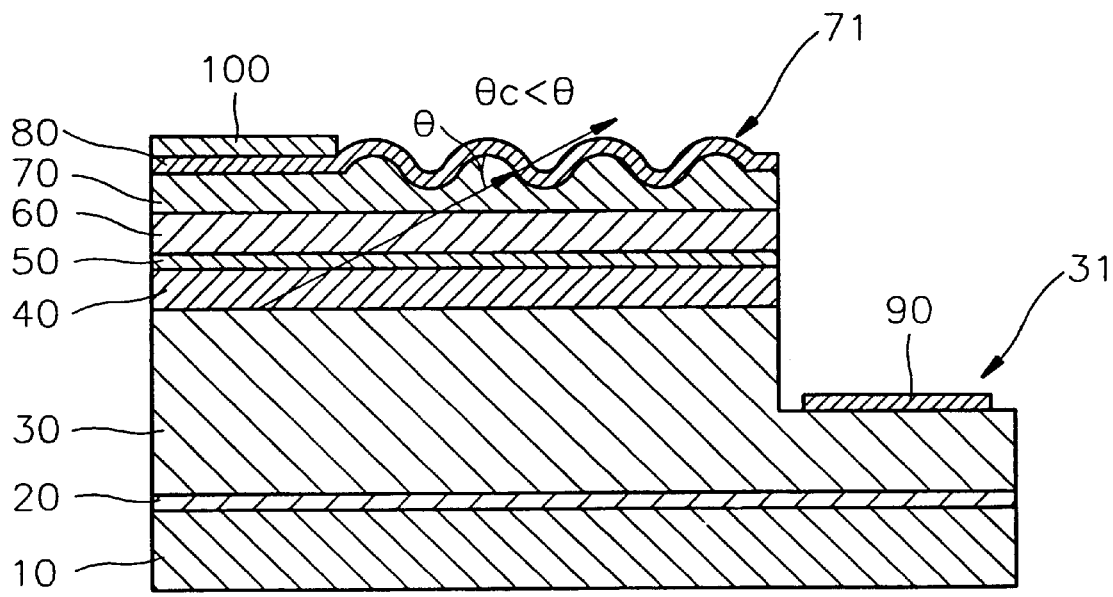
FIG. 3 is a sectional view illustrating an embodiment of an SLED according to the present invention.

Referring to FIG. 3, a buffer layer 20 is formed on a substrate 10. The substrate 10 is formed of sapphire and the buffer layer 20 is formed of GaN or AlN. A lower contact layer 30 formed of n-GaN is formed on the buffer layer 20. An etched step portion is provided at one side of the lower contact layer 30, and a lower ohmic metal layer 90 formed of Ti/Al is formed on the step portion. A lower clad layer 40 formed of n-GaN or n-AlGaN is formed on the lower contact layer 30. An active layer 50 formed of GaN or InGaN is formed on the lower clad layer 40. An upper clad layer 60 formed of P-GaN or P-Al GaN is formed on the active layer 50. An upper contact layer 70 formed of p-GaN is formed on the clad layer 60, and a translucent upper ohmic metal layer 80 formed of NiCrAu or NiAu is sequentially deposited on the upper contact layer 70. A wire bonding pad 100 is partially deposited on the upper surface of the ohmic metal layer 80.

In the above structure, the material of each layer can be altered according to general technical specifications, in response to the color of emitted light or requirements. The material specifications will be omitted in the following description of the present embodiment since the technical specifications mentioned here are well known.

Figure 7:
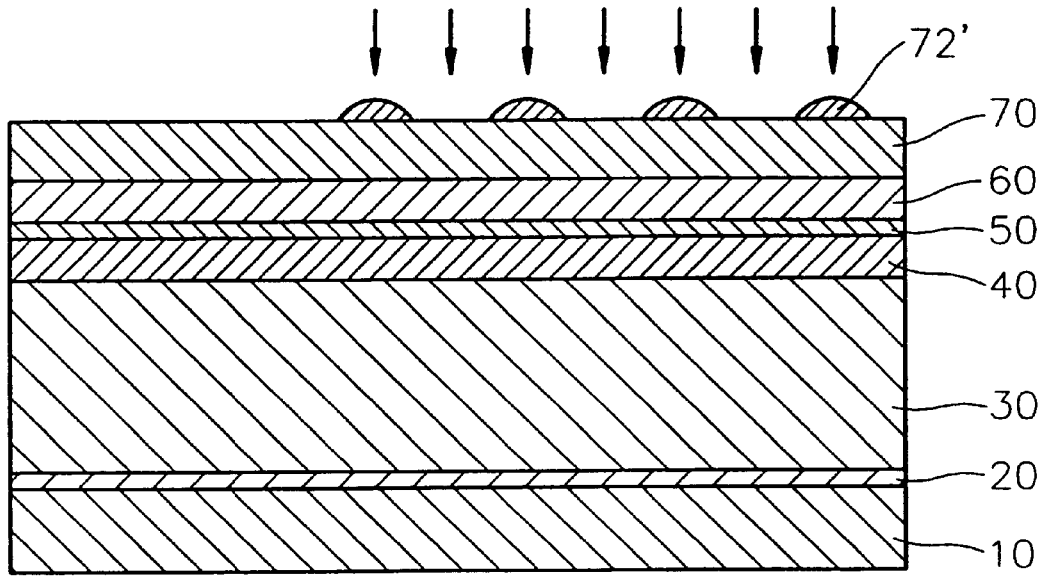

It is a characteristic feature of the SLED of the present invention that a portion 71 of the upper contact layer 70 is uneven, and more particularly, is substantially sinusoidal (see FIG. 7). Thus, the shape of the upper ohmic metal layer 80 formed on the substantially sinusoidal uneven portion 71 conforms to shape of the substantially sinusoidal uneven portion 71.

The shape of the substantially sinusoidal uneven portion 71 can be modified to increase the surface area of the upper contact layer 70. The reason is to increase the area of contact with the ohmic metal layer, to reduce resistance of the contact surface, thereby lowering the operating voltage needed for light emission. Since reduced operating voltage directly contributes to the reduction of heat generated, durability of the SLED can be improved. In the above structure, it is preferable that the substantially sinusoidal uneven portion 71 is processed to operate as an optical lens. When the substantially sinusoidal uneven portion 71 operates as a lens, the light emitted from the active layer 50 is condensed and focused by the substantially sinusoidal uneven portion 71 and then passes through the upper ohmic metal layer 80. In particular, when the light incident on the upper contact layer 70 at a predetermined angle is input to the dome-shaped, substantially sinusoidal uneven portion 71, the incident angle $\theta$ becomes greater than the critical angle $\theta_c$ due to the uneven portion of the substantially sinusoidal uneven portion 71 according to Snell's law. Thus, as the amount of loss of light totally reflected at the boundary surface to return is sharply reduced, the amount of light actually used is drastically increased.

A preferred embodiment of a method for manufacturing the SLED having the above structure according to the present invention will now be described with reference to FIGS. 4 through 9.

Figure 4:
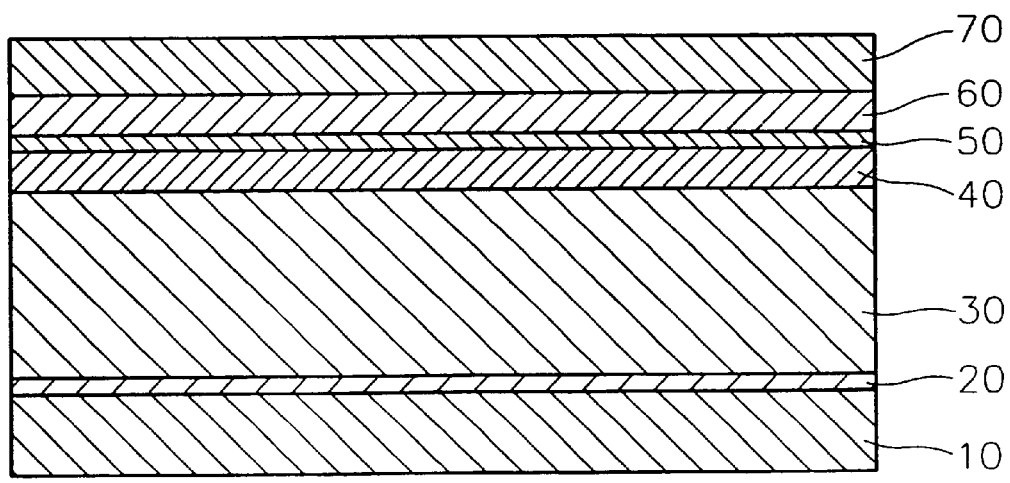
FIGS. 4 through 9 are sectional views showing a manufacturing method according to the present invention.

As shown in FIG. 4, a semiconductor stack comprising a buffer layer 20, a lower contact layer 30, a lower clad layer 40, an active layer 50, an upper clad layer 60, and an upper contact layer 70, is grown by a common growing method on a substrate 10 which is formed of sapphire. The buffer layer 20 is formed of GaN or AlN. The lower contact layer 30 on the buffer layer is formed of doped n-GaN. The lower clad layer 40 on the lower contact layer 30 is formed of doped n-GaN or n-GaN. The active layer 50 on the lower clad layer 40 is formed of GaN or InGaN. The upper clad layer 60 of p-GaN or p-AlGaN is grown on the active layer 50. The upper contact layer 70 on the clad layer 60 is formed of p-GaN.

Figure 5:
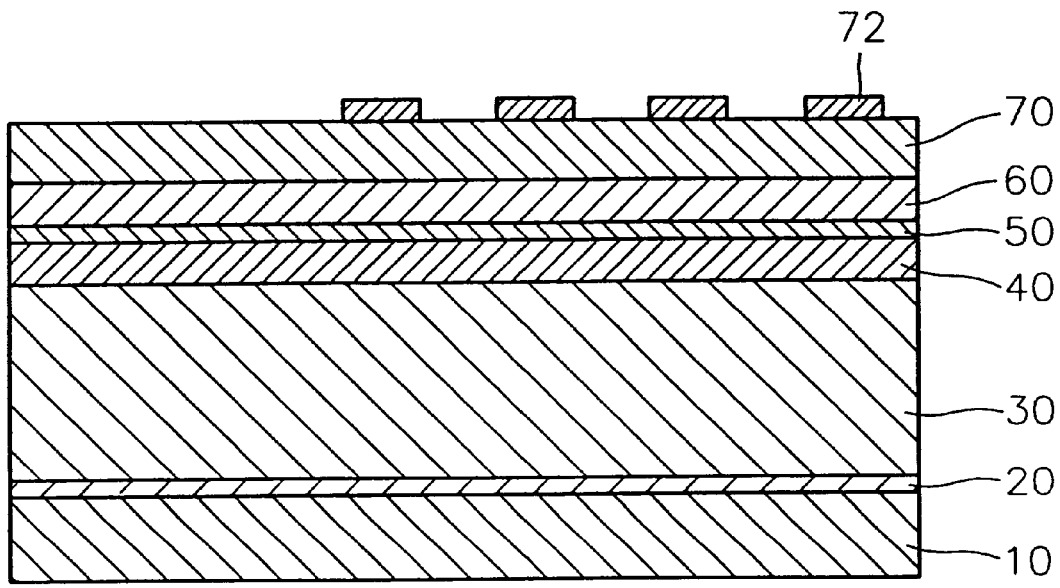
Figure 10:
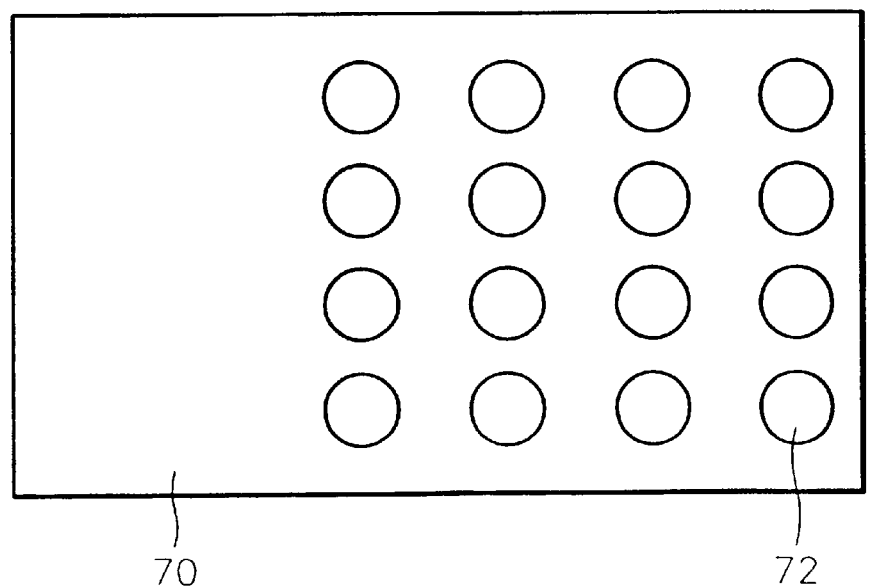
FIG. 10 is a plan view of the SLED shown in FIG. 5.

As shown in FIGS. 5 and 10, a predetermined pattern, e.g., an etching mask of a disk mask pattern 72, is partially formed on the surface of the upper contact layer 70 which is the uppermost layer of the semiconductor stack with photoresist using a photolithography method. Here, it is preferable that the material used for the etching mask 72 has an etching rate similar to that of the upper contact layer 70, when being etched by a predetermined etching method.

Figure 6:
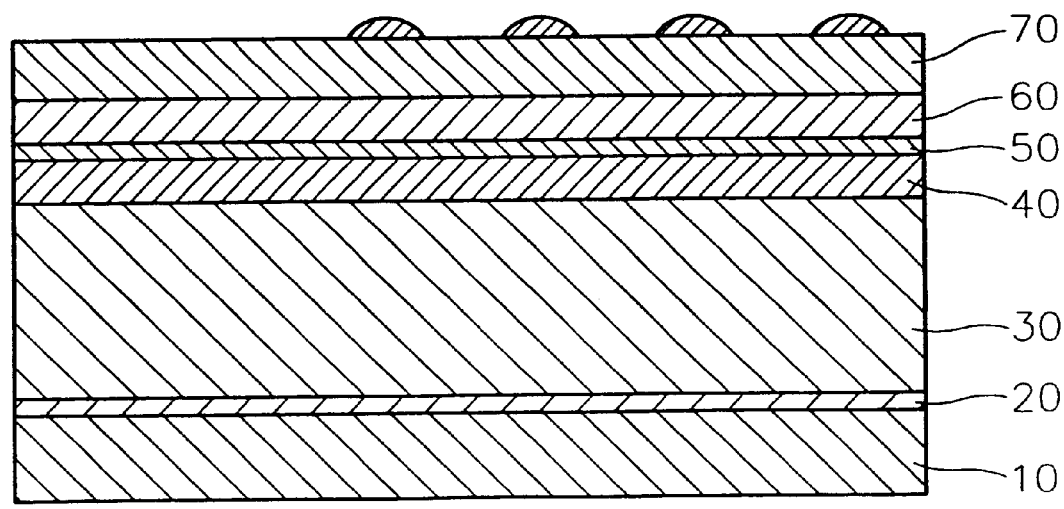

In FIG. 6, the etching mask 72 is heated to within a predetermined temperature range. A portion of the mask pattern is melted down due to the heat, and the upper portion thereof becomes dome-shaped.

Figure 8:
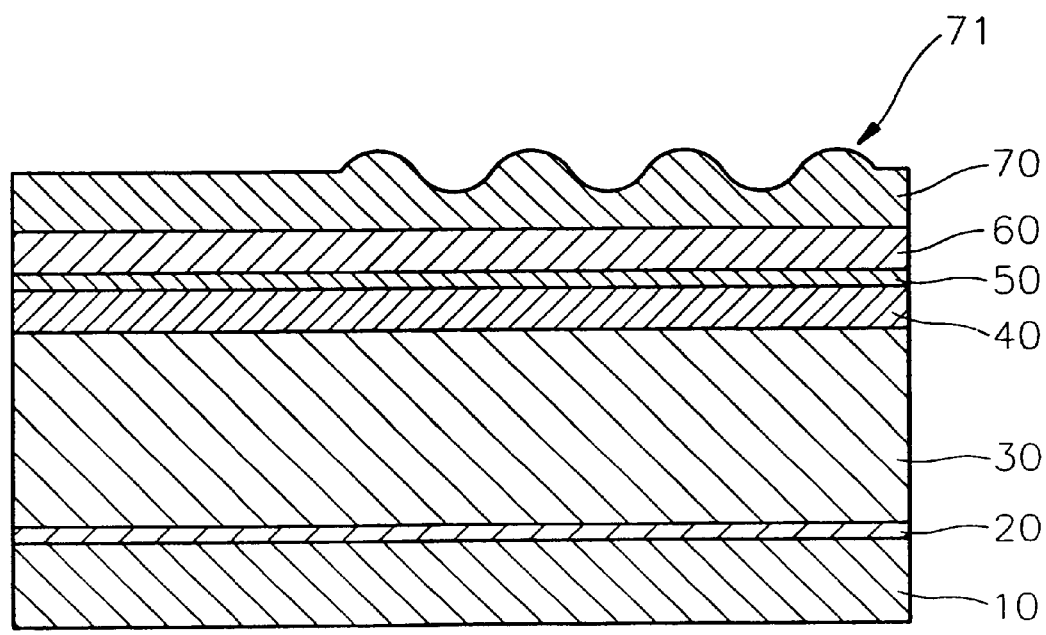

As shown in FIG. 7, a common dry etching is performed to cut away an exposed portion of the upper contact layer 70 which is not covered with the etching mask 72. In doing so, the etching mask 72' is also etched, and consequently, a substantially sinusoidal uneven portion 71 is finally formed on the upper portion of the upper contact layer 70, as shown in FIG. 8.

Figure 9:
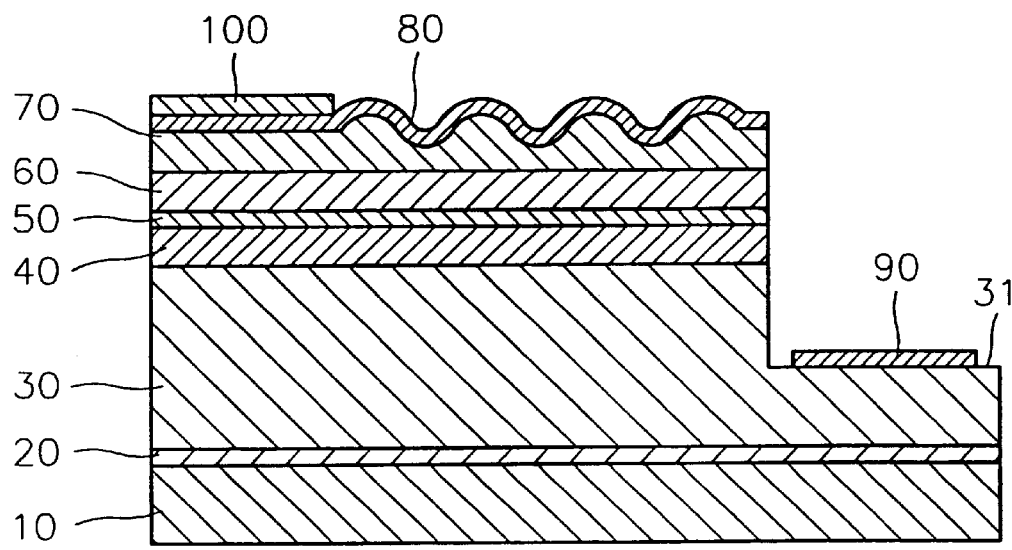

As shown in FIG. 9, a stepped portion 31 is formed at one side of the lower contact layer 30 by partially etching from the upper contact layer 70 down to the middle of the lower contact layer 30. Next, the translucent upper ohmic metal layers 80 and 90 formed of NiCrAu or NiAu are formed on the upper contact layer 70 where the substantially sinusoidal uneven portion 71 is formed and the stepped portion 31, respectively. The wire bonding pad 100 is partially formed on the upper ohmic metal layer 80 other than where the substantially sinusoidal uneven portion 71 is formed, thus obtaining a SLED of a desired shape.

Figure 11:
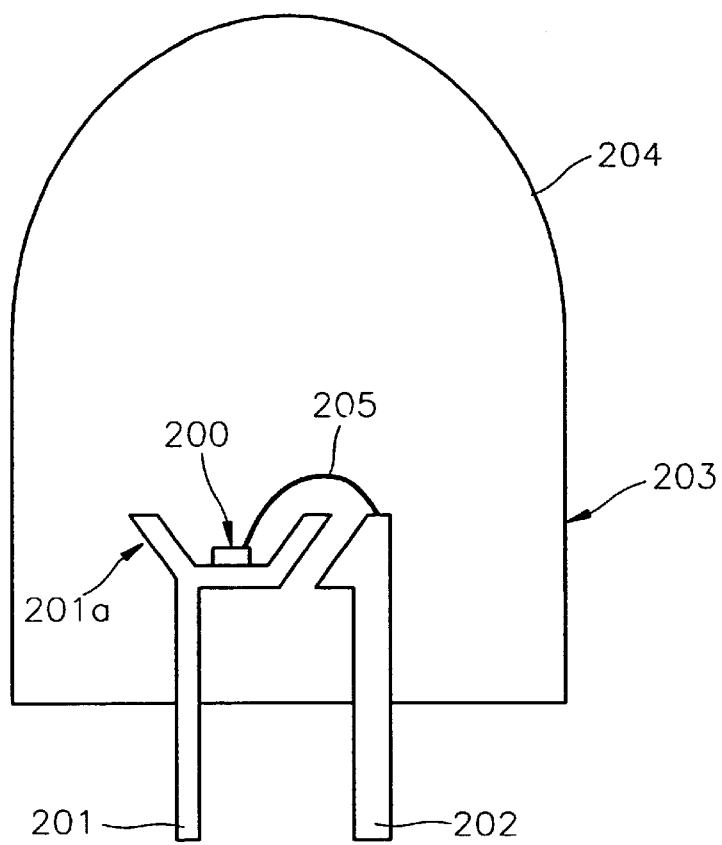
FIG. 11 is a sectional view of a SLED package adopting the conventional SLED.

Referring to FIG. 11, in an LED package adopting the conventional LED, an LED 200 is fixed to the bottom surface of a cup-shaped fixing portion 201a provided at the upper end of a first lead 201 and a wire bonding pad (not shown) of the LED is electrically connected to the upper end of a second lead 202 by a wire 205. The elements are protected by an epoxy resin body 203 having a dome-shaped lens portion 204 formed at the upper portion thereof. In the conventional LED package having the above structure, part of light emitted upward from the LED is condensed and focused by the lens portion 204 to proceed in a particular direction. However, a conventional LED package becomes large due to the dome-shaped lens portion 204.

Figure 12:
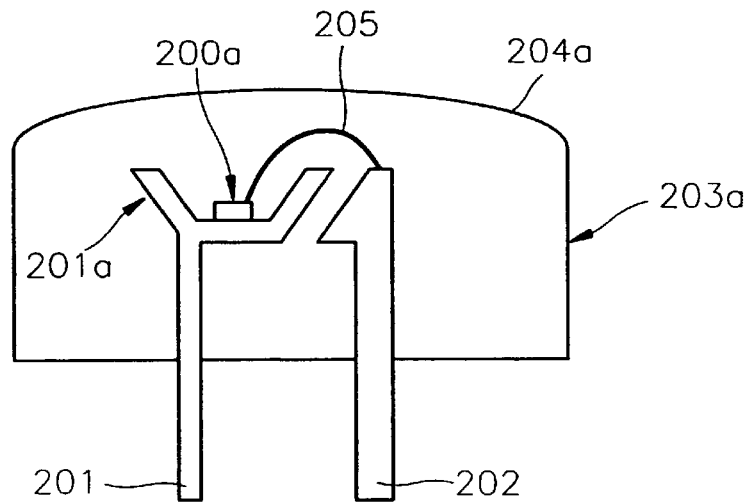
FIG. 12 is a sectional view of a SLED package adopting the SLED according to the present invention.

In FIG. 12, an LED package adopting the LED of the present invention does not have the lens portion shown in FIG. 11. An upper surface 204a of an epoxy resin body 203a is located quite close to LED 200a. This is possible because the lens portion of the conventional LED package is replaced by the uneven portion of the LED of the present invention. Therefore, the LED package adopting the LED of the present invention can be manufactured in a smaller size than the conventional one.

As described above, in the LED according to the present invention, most photons reflected inside the semiconductor not contributing to the output of light is emitted in the present invention. Thus, the external quantum efficiency increases much. Also, as the external quantum efficiency increases, the amount of light absorbed in the LED so that heat generated in the LED is lowered and the life span thereof can be extended.

Also, the light from the light generating layer is focused by the uneven portion, giving directivity thereto, so that applicability thereof is improved. In particular, not depending on the dome-shaped epoxy resin body having an additional lens portion, the light from the light generating layer is provided with directivity by the uneven portion so that the size of the LED package can be reduced and more light can be emitted.

Furthermore, in the LED according to the present invention, ohmic contact resistance is reduced due to the increase in the ohmic contact area compared to the conventional LED. Such reduction in the operating voltage results in a reduction in the amount of heat generated in the LED. Accordingly, leakage current due to thermal runaway can be prevented, a crystal defect of a semiconductor of the LED due to thermal stress can be reduced, and the life span of the LED can be extended.

What is claimed is:

1. A surface-emitting light-emitting diode comprising:
    a substrate;
    a light generating layer comprising an active layer for generating light, and an upper clad layer and a lower clad layer formed on and below said active layer, respectively;
    a lower contact layer formed between said light generating layer and said substrate;
    a buffer layer formed between said lower contact layer and said substrate;
    a lower ohmic metal layer which ohmically contacts one side of said lower contact layer;
    an upper contact layer formed on said light generating layer and having a substantially sinusoidal uneven surface portion; and
    a light transmissive upper ohmic metal layer formed on said upper contact layer,
        wherein said active layer is composed of GaN or AlN, said lower contact layer is composed of doped n-GaN, said upper contact layer is composed of doped p-GaN, and said uneven surface portion increases the contact area between said upper contact layer and light transmissive upper ohmic metal layer for reducing the contact resistance therebetween.

2. The surface-emitting light-emitting diode as claimed in claim 1, wherein said uneven surface portion is formed in accordance with a predetermined pattern.

3. The surface-emitting light-emitting diode as claimed in claim 1, wherein said uneven surface portion is formed to operate as an optical lens for condensing the light passed through from said light generating layer to said transmissive upper ohmic metal layer.

4. The surface-emitting light-emitting diode as claimed in claim 1, wherein said buffer layer consists essentially of GaN or AlN.

5. The surface-emitting light-emitting diode as claimed in claim 1, wherein said lower clad layer is composed of doped n-GaN or n-AlGaN.

6. The surface-emitting light-emitting diode as claimed in claim 1, wherein said upper clad layer is composed of p-GaN or p-AlGaN.

* * * * *